United States Patent
Wong et al.

(10) Patent No.: US 7,780,064 B2
(45) Date of Patent: Aug. 24, 2010

(54) WIRE BONDING METHOD FOR FORMING LOW-LOOP PROFILES

(75) Inventors: Yam Mo Wong, Singapore (SG); Mow Huat Goh, Johor (MY)

(73) Assignee: ASM Technology Singapore Pte Ltd, Singapore (SG)

( * ) Notice: Subject to any disclaimer, the term of this patent is extended or adjusted under 35 U.S.C. 154(b) by 68 days.

(21) Appl. No.: 11/753,957

(22) Filed: May 25, 2007

(65) Prior Publication Data
US 2007/0284416 A1    Dec. 13, 2007

Related U.S. Application Data

(60) Provisional application No. 60/810,782, filed on Jun. 2, 2006.

(51) Int. Cl.
*B23K 31/02* (2006.01)
(52) U.S. Cl. .............. 228/180.5; 228/4.5; 228/1.1; 257/777; 257/784
(58) Field of Classification Search ........... 228/180.5, 228/1.1, 110.1, 101, 4.5; 257/784, 780, 686, 257/734, 777, 764
See application file for complete search history.

(56) References Cited

U.S. PATENT DOCUMENTS

| | | | | |
|---|---|---|---|---|
| 5,961,029 A | * | 10/1999 | Nishiura et al. | 228/180.5 |
| 6,112,974 A | * | 9/2000 | Nishiura et al. | 228/180.5 |
| 6,933,608 B2 | | 8/2005 | Fujisawa | 257/738 |
| 7,014,095 B2 | * | 3/2006 | Mochida | 228/180.5 |
| 7,229,906 B2 | * | 6/2007 | Babinetz et al. | 438/617 |
| 2004/0041008 A1 | * | 3/2004 | Mochida | 228/180.5 |
| 2004/0104477 A1 | * | 6/2004 | Fujisawa | 257/738 |
| 2004/0152292 A1 | * | 8/2004 | Babinetz et al. | 438/617 |
| 2005/0072833 A1 | * | 4/2005 | Wong et al. | 228/180.5 |

* cited by examiner

*Primary Examiner*—Roy King
*Assistant Examiner*—Michael Aboagye
(74) *Attorney, Agent, or Firm*—Ostrolenk Faber LLP

(57) ABSTRACT

A method of forming a wire bond with a bonding tool is provided that comprises the steps of forming a ball bond onto a bonding surface, raising the bonding tool away from the ball bond to form a neck portion integrated with a top of the ball bond, locating a circumference of a tip of the bonding tool onto the neck portion, pressing the neck portion with the circumference of the tip to form a depression in the neck portion without bonding the neck portion to the ball bond, and thereafter raising the bonding tool away from the ball bond.

10 Claims, 3 Drawing Sheets

WIRE BONDING METHOD FOR FORMING LOW-LOOP PROFILES

CROSS REFERENCE TO RELATED APPLICATION

This application claims the benefit and priority of U.S. Provisional Application Ser. No. 60/810,782 filed Jun. 2, 2006, and entitled WIRE BONDING METHOD FOR FORMING LOW-LOOP PROFILES, the disclosure of which is incorporated herein by reference.

FIELD OF THE INVENTION

The invention relates to wire bonding to electrically connect different electrical contact pads of electronic components using wires, and in particular, to the formation of wire loops with low height profiles.

BACKGROUND AND PRIOR ART

During certain semiconductor assembly processes, semiconductor dice are placed on a carrier such as a leadframe substrate. Electrical connections in the form of wire bonds are then made between the dice and substrate, or between individual dice. Gold, aluminium or copper wires are commonly used to make these connections. Wire bonds are formed at bonding sites where the electrical connections are to be made, typically using an ultrasonic transducer to generate ultrasonic energy to attach a length of wire fed from a capillary to the semiconductor device or carrier. After these wire bonds are made, the dice, wire loops and substrate are encapsulated with a resin material to protect the same. A semiconductor package is thus produced.

There is a continuing desire in the semiconductor industry to develop ever smaller and thinner semiconductor packages. Since, as explained above, the wire loops should be fully encapsulated in the final package, the thickness of the package would be affected by the heights of the wire loops that are formed during wire bonding. If the heights of the wire loops can be kept to a minimum, then the thickness of the final package can be correspondingly reduced.

Furthermore, there is a demand in the industry for semiconductor devices with stacked dice. The advantage of having stacked dice is that stacked dice incorporate more silicon functionality by stacking multiple dice into a single package. This reduces overall size by eliminating additional packages on the circuit board. Furthermore, it increases space savings while enhancing electrical performance by reducing propagation time for signals to traverse from one chip to another. Stacked dice allow a greater density of integrated circuits on a given area of the carrier, and may increase efficiency. Since each die in the stack would require an electrical connection to the carrier, or to another die, several layers of wire loops are formed. Correspondingly, it would be better for wire loops to be profiled as low as possible to cater for this need.

Thus, there is a desire in the semiconductor industry to seek to address this need to form wire loops with low height profiles. For example, U.S. Pat. No. 6,933,608 entitled "Wire Loop, Semiconductor Device Having Same, Wire Bonding Method and Wire Bonding Apparatus" seeks to form a low wire loop by crushing a part of a bonding wire onto a top of a bonded ball with a capillary. The wire loop is then extended from the crushed wire.

A problem with this approach of crushing the bonding wire by bonding it to the ball bond is that the strength of the neck portion of the wire bond is weak. This makes it more susceptible to neck crack and breakage. As such, the wire pull strength of the wire bond is reduced. Further, the crushing of the bonding wire onto the ball bond may weaken the strength of the ball bond, resulting in weakened adhesion between the ball bond and the bonding surface. Moreover, additional wire is required to loop the wire backwards and then bond the wire to the ball. This wire that is looped backwards is unused. Thus, there is unnecessary wastage of bonding wire.

SUMMARY OF THE INVENTION

It is thus an object of the invention to seek to provide a method of forming a wire bond wherein a height of a wire loop connecting different bonding points may be reduced while avoiding some of the aforesaid disadvantages of prior art wire bonds.

According to a first aspect of the invention, there is provided a method of forming a wire bond with a bonding tool, comprising the steps of: forming a ball bond onto a bonding surface; raising the bonding tool away from the ball bond to form a neck portion integrated with a top of the ball bond; locating a circumference of a tip of the bonding tool onto the neck portion; pressing the neck portion with the circumference of the tip to form a depression in the neck portion without bonding the neck portion to the ball bond; and thereafter raising the bonding tool away from the ball bond.

According to a second aspect of the invention, there is provided a wire bond comprising a ball portion, a neck portion on top of the ball portion that is constructed by directly extending a bonding wire from the ball portion in a direction of a wire loop, a depression on the neck portion and the wire loop extending from a side of the depression away from the neck portion.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

An example of a preferred embodiment of a wire bonding method in accordance with the invention will now be described with reference to the accompanying drawings, in which.

DETAILED DESCRIPTION OF THE PREFERRED EMBODIMENT

Figure 1:
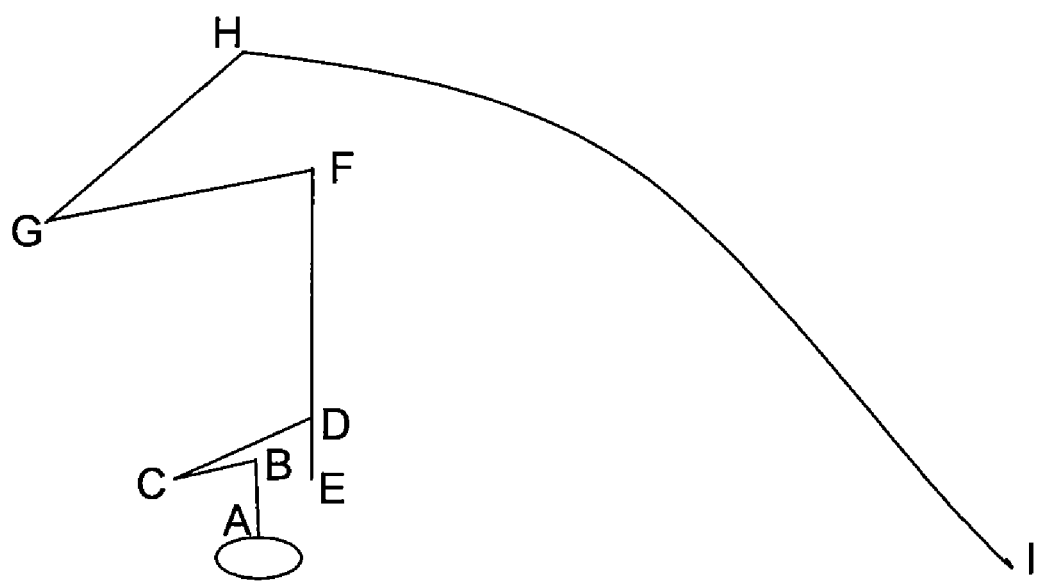
FIG. 1 is side view of a loop motion profile of a wire bonding tool employing a wire bonding method according to the preferred embodiment of the invention.
Figure 3:
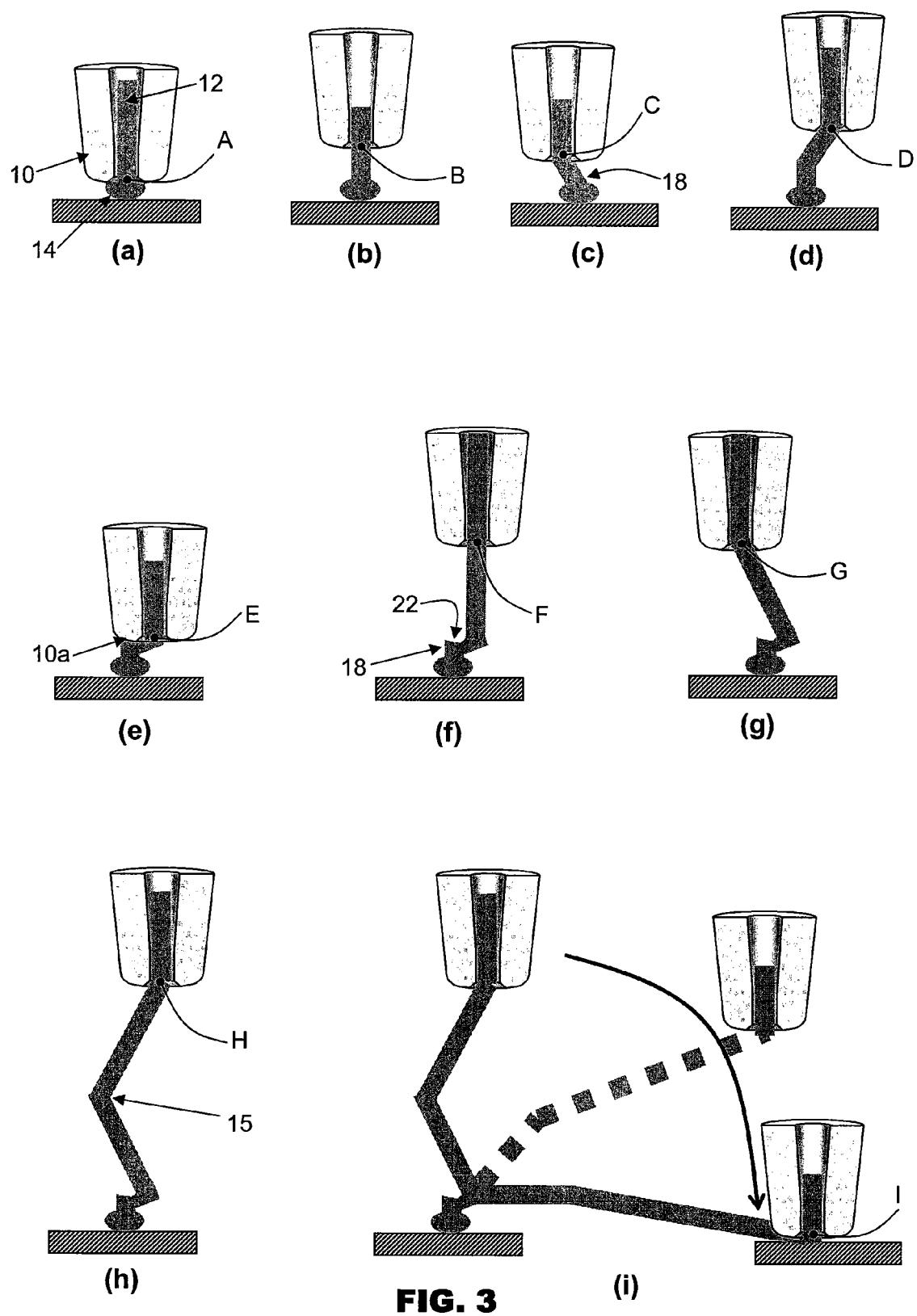
FIGS. 3($a$) to 3($i$) are diagrammatic illustrations showing the shapes of a bonding wire at different positions of a bonding tool during loop formation according to the preferred embodiment of the invention.

FIG. 1 is side view of a loop motion profile of a wire bonding tool 10 employing a wire bonding method according to the preferred embodiment of the invention. FIGS. 3($a$) to 3($i$) are diagrammatic illustrations showing the shapes of a bonding wire 12 at different positions of a bonding tool 10 during loop formation The bonding tool, such as a capillary 10, is used to feed bonding wire 12 to bond the wire between a first bonding position A and a second bonding position I. A ball bond 14 is first made at the first bonding position A. The capillary 10 is then moved substantially vertically upwards away from the first bond 14 to point B.

At point B, the capillary 10 is moved in a reverse motion diagonally downwards and in a direction away from a second bonding position I to point C. This reverse motion forms a neck portion 18 at the top of the ball bond 14 and bends the wire 12. From point C, the capillary 10 is moved diagonally upwards to point D towards the direction of the second bonding position I. At point D, the capillary 10 is positioned above the wire bond such that a circumference 10a of a tip of the capillary 10 is directly over the wire bond 14.

The capillary 10 then moves down towards the wire bond 14 to point E. This motion preferably causes the capillary's circumference 10a to press down on the wire bond 14, so that the neck portion 18 on top of the wire bond 14 is flattened. In pressing down on the wire, only a downwards force but no bonding energy is provided onto the top of the wire bond 14. As a consequence, a depression 22 is formed at the top of the wire bond 14 on the neck portion 18. Unlike the prior art, the neck portion 18 is not bonded to the ball bond.

After that, the capillary 10 moves vertically upwards away from the wire bond 14 to point F. The capillary 10 then moves away from the second bonding position in a reverse action motion to point G, and thereafter, the capillary 10 is raised further to point H in a direction towards the second bonding position. This forms a kink 15 at a point of the wire to ensure that there is a gap between the looped wire and a bonding surface. The capillary 10 is then moved down to the second bonding position I, whereat a second wire bond is formed. The electrical connection between the first and second bonding positions is thus complete. Preferably, a wire clamp for controlling release of the wire is open at all times during motion of the capillary 10 from points A to H conducted over the first bonding position, such that the motions of the capillary 10 to form a depression in the neck portion 18 are conducted without the bonding wire 12 being clamped by a wire clamp. From points H to I, the wire clamp is closed to pull the wire to the second bonding position.

Figure 2:
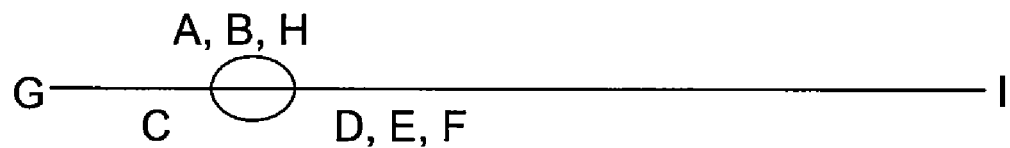
FIG. 2 is a top view of the loop motion profile of FIG. 1.

FIG. 2 is a top view of the loop motion profile of FIG. 1. It would be observed that the motion of the capillary 10 from point A through to point I is generally in a straight line from the top view of the motion profile. Thus, all the points lie substantially on the same plane.

Figure 4:
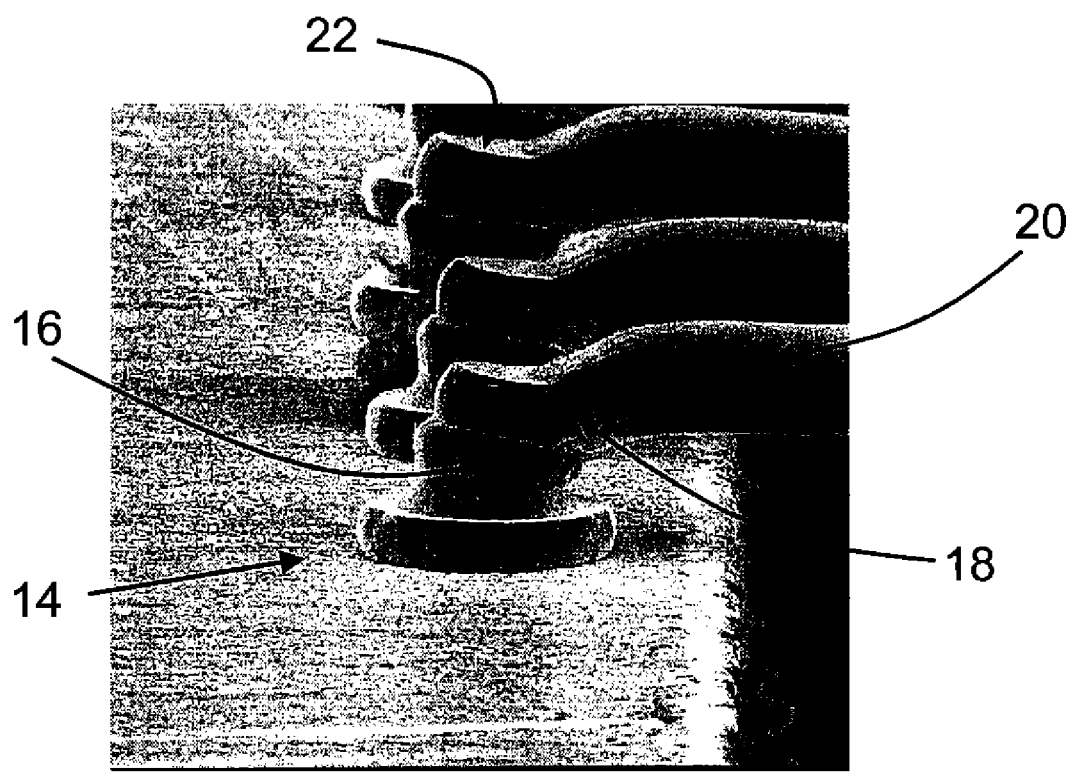
FIG. 4 is a perspective view of low wire loops formed using the wire bonding method according to the preferred embodiment of the invention.

FIG. 4 is a perspective view of low wire loops formed using the wire bonding method according to the preferred embodiment of the invention. The wire bond 14 is bonded onto a bonding surface and comprises a ball-bonded base portion 16, a neck portion 18 integrated with a top of the base portion 16 and a wire portion 20 extending substantially horizontally from the neck portion 18. Thus, there is virtually no vertical rise in the wire loop above the top of the base portion 16.

It is observed that the top of the neck portion 18 is deformed by the pressure exerted by the capillary's circumference 10a onto the top of the base portion 16 during the aforesaid wire bonding process to form a depression 22. This deformation helps to keep the height of the wire portion 20 low by restricting the height of the neck portion 18. As seen in FIG. 4, the depression 22 in the deformed neck portion 18 also causes the neck portion 18 to have a smaller cross-sectional area than the wire portion 20 that extends from it.

The invention described herein is susceptible to variations, modifications and/or additions other than those specifically described and it is to be understood that the invention includes all such variations, modifications and/or additions which fall within the spirit and scope of the above description.

The invention claimed is:

1. A method of forming a wire bond with a bonding tool operating a wire, the bonding tool including a tip, the method comprising the steps of:
   forming a ball bond onto a bonding surface;
   raising the bonding tool away from the ball bond to form a neck portion extending from a top of the ball bond;
   positioning a circumference of the tip of the bonding tool onto the neck portion positioned on the top of the ball bond;
   pressing the neck portion with the circumference of the tip to flatten and to form a downward depression in the neck portion of the wire directly on the top of the ball bond, such that a height of the neck portion at the depression is less than a height of the wire extending from the depression on another side of the depression than the ball bond, wherein the height of the neck portion at the depression is measured from a top surface of the neck portion at the depression to a closest bottom of the neck portion and the height of the wire extending from the depression is measured from a top surface of the wire extending from the depression to a closest bottom surface of the wire extending from the depression, without bonding the neck portion to the ball bond; and
   raising the bonding tool away from the ball bond; and thereafter
   forming a kink in the wire by a reverse motion in a direction away from a second bonding position.

2. The method as claimed in claim 1, further comprising moving the bonding tool in a reverse motion diagonally downwards towards the bonding surface in a direction away from a second bonding position, after forming the ball bond and before positioning the circumference of the tip of the bonding tool onto the neck portion.

3. The method as claimed in claim 2, further comprising moving the bonding tool diagonally upwards in a direction towards the second bonding position, after the moving of the bonding tool in the reverse motion, until the circumference of the tip of the bonding tool is directly over the ball bond.

4. The method as claimed in claim 1, wherein the step of pressing the neck portion comprises a downward force pressing the tip of the bonding tool onto the neck portion without applying any ultrasonic energy.

5. The method as claimed in claim 1, further comprising:
   moving the bonding tool to the second bonding position while extending the wire to create a wire loop; and
   forming a second wire bond at the second bonding position after the forming of the kink.

6. The method as claimed in claim 1, wherein all motions of the bonding tool lie on one plane.

7. The method as claimed in claim 1, wherein the motions of the bonding tool are conducted without the wire being clamped by a wire clamp.

8. A method of forming a wire bond with a bonding tool operating a wire, the bonding tool including a tip, the method comprising the steps of:
   forming a ball bond onto a bonding surface;
   raising the bonding tool away from the ball bond to form a neck portion extending from a top of the ball bond;
   positioning a circumference of the tip of the bonding tool onto the neck portion positioned on the top of the ball bond;
   pressing the neck portion with the circumference of the tip to form a downward depression in the neck portion on the top of the ball bond, such that a height of the neck portion at the depression is less than a height of the wire extending from the depression on another side of the depression than the ball bond, wherein the height of the neck portion at the depression is measured from a top surface of the neck portion at the depression to a closest bottom of the neck portion and the height of the wire extending from the depression is measured from a top surface of the wire extending from the depression to a closest bottom surface of the wire extending from the depression, without bonding the neck portion to the ball bond; and thereafter raising the bonding tool away from the ball bond, wherein the method further comprises moving the bonding tool in a reverse motion diagonally downwards towards the bonding surface in a direction away from a second bonding position, after forming the ball bond and before positioning the circumference of the tip of the bonding tool onto the neck portion.

9. The method as claimed in claim 8, further comprising moving the bonding tool diagonally upwards in a direction towards the second bonding position, after the moving of the bonding tool in the reverse motion, until the circumference of the tip of the bonding tool is directly over the ball bond.

10. A method of forming a wire bond with a bonding tool operating a wire, the bonding tool including a tip, the method comprising the steps of:

forming a ball bond onto a bonding surface;

raising the bonding tool away from the ball bond to form a neck portion extending from a top of the ball bond;

positioning a circumference of the tip of the bonding tool onto the neck portion positioned on the top of the ball bond;

pressing the neck portion with the circumference of the tip to form a downward depression in the neck portion on the top of the ball bond, such that a height of the neck portion at the depression is less than a height of the wire extending from the depression on another side of the depression than the ball bond, wherein the height of the neck portion at the depression is measured from a top surface of the neck portion at the depression to a closest bottom of the neck portion and the height of the wire extending from the depression is measured from a top surface of the wire extending from the depression to a closest bottom surface of the wire extending from the depression, without bonding the neck portion to the ball bond; and thereafter raising the bonding tool away from the ball bond, wherein the method further comprises:

moving the bonding tool to the second bonding position while extending the wire to create a wire loop; and forming a second wire bond at the second bonding position after the forming of the kink.

\* \* \* \* \*